(12) United States Patent
Huynh Bao et al.

(10) Patent No.: US 11,087,837 B2
(45) Date of Patent: Aug. 10, 2021

(54) CIRCUIT CELL FOR A MEMORY DEVICE OR LOGIC DEVICE

(71) Applicant: IMEC VZW, Leuven (BE)

(72) Inventors: Trong Huynh Bao, Leuven (BE); Sushil Sakhare, Heverlee (BE)

(73) Assignee: IMEC vzw, Leuven (BE)

( * ) Notice: Subject to any disclaimer, the term of this patent is extended or adjusted under 35 U.S.C. 154(b) by 63 days.

(21) Appl. No.: 16/727,653

(22) Filed: Dec. 26, 2019

(65) Prior Publication Data

US 2020/0211642 A1 Jul. 2, 2020

(30) Foreign Application Priority Data

Dec. 28, 2018 (EP) .................................... 18248218

(51) Int. Cl.
| G11C 8/10 | (2006.01) |
| G11C 17/02 | (2006.01) |
| G11C 13/00 | (2006.01) |
| G11C 14/00 | (2006.01) |

(52) U.S. Cl.
CPC .......... *G11C 13/003* (2013.01); *G11C 14/009* (2013.01); *G11C 2213/79* (2013.01)

(58) Field of Classification Search
CPC ............ G11C 14/0054; G11C 13/0004; G11C 14/009; G11C 13/0002; G11C 13/0007; G11C 13/003; G11C 13/0033; G11C 17/16; G11C 13/004; G11C 11/1659; G11C 17/18; G11C 8/14; G11C 11/21; G11C 11/161; G11C 13/0023; G11C 17/02; G11C 8/10; G11C 11/165; G11C 5/04; G11C 7/12; G11C 8/16
See application file for complete search history.

(56) References Cited

U.S. PATENT DOCUMENTS

| 8,331,134 B2 * | 12/2012 | Chiu | .................... | G11C 14/009 |
| | | | | 365/154 |
| 8,508,983 B2 * | 8/2013 | Wang | .................. | G11C 14/0054 |
| | | | | 365/154 |
| 9,349,440 B1 * | 5/2016 | Ma | ........................ | G11C 13/004 |

(Continued)

OTHER PUBLICATIONS

European Search Report, European Patent Application No. 18248218. 2, dated Jul. 12, 2019, 7 pages.

*Primary Examiner* — Hien N Nguyen
(74) *Attorney, Agent, or Firm* — McDonnell Boehnen Hulbert & Berghoff LLP

(57) ABSTRACT

A circuit cell for a memory device or a logic device comprises: (i) first and a second logic gates having respective output nodes; and (ii) first and second memory units, each comprising (a) first and second terminals and (b) a resistive memory element and a bipolar selector connected in series between the first and second terminals, wherein the first terminals of the first and second memory units are connected to the output nodes of the first and second logic gates, respectively, wherein the resistive memory elements are configured to be switchable between first and second resistance states, and wherein in response to a switching current and the bipolar selectors are configured to be conducting in response to an absolute value of a voltage difference across the bipolar selectors exceeding a threshold voltage of the bipolar selectors and non-conducting in response to the absolute value being lower than the threshold.

20 Claims, 9 Drawing Sheets

(56) References Cited

U.S. PATENT DOCUMENTS

| | | | |
|---|---|---|---|
| 10,726,914 B2 * | 7/2020 | Chung | ................ G11C 13/004 |
| 2004/0125660 A1 * | 7/2004 | Ooishi | ............ H03K 19/17752 |
| | | | 365/189.05 |
| 2005/0128791 A1 | 6/2005 | Kang | |
| 2011/0280073 A1 | 11/2011 | Chiu et al. | |
| 2012/0320658 A1 | 12/2012 | Wang et al. | |
| 2021/0074365 A1 * | 3/2021 | Dinh | .................. G11C 7/1042 |

* cited by examiner

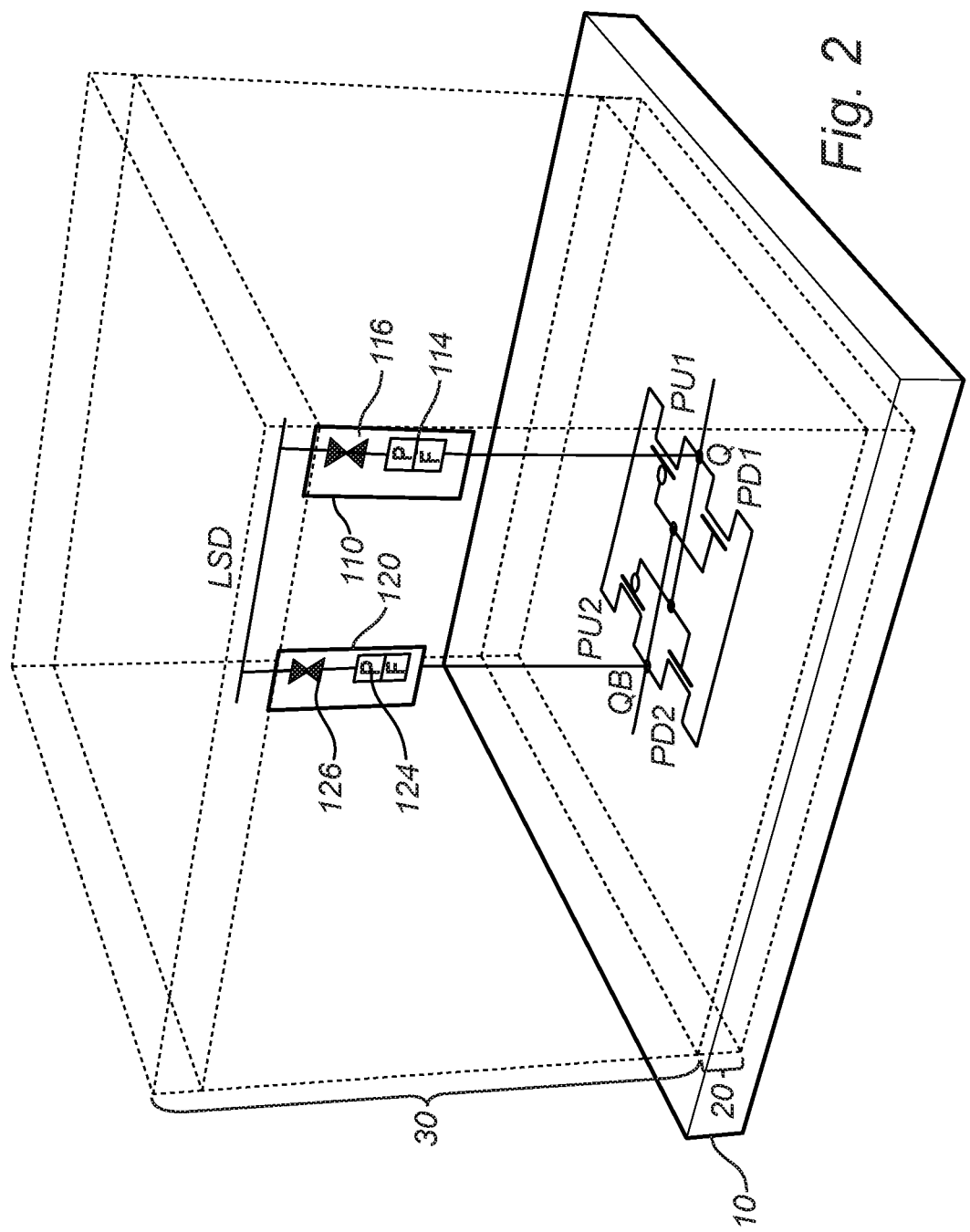

CIRCUIT CELL FOR A MEMORY DEVICE OR LOGIC DEVICE

CROSS-REFERENCE TO RELATED APPLICATION

The present application is a non-provisional patent application claiming priority to European Patent Application No. 18248218.2 filed Dec. 28, 2018, the contents of which are hereby incorporated by reference.

TECHNICAL FIELD

The present disclosure relates to a circuit cell for a memory device or logic device. The present disclosure further relates to a memory device or a logic device comprising such a circuit cell.

BACKGROUND

A bit cell or memory cell of a static random access memory (SRAM) comprises two complementary storage nodes, which may be denoted Q and QB, respectively, each arranged in a respective half-cell of the memory cell. The storage node of each half-cell is formed by an output node of a respective CMOS inverter, which is cross-coupled to the CMOS inverter of the other half-cell. This provides the memory cell with two stable logic states: a high logic level voltage (e.g., a logic "1") at Q and a low logic level voltage (e.g., a logic "0") at QB, and vice versa. The storage nodes Q and QB may be accessed from respective ones of a pair of complementary bit lines, which may be denoted BL and BLB, via a respective access or pass transistor, controlled via a word line. Complementary logic level voltages may be supplied to the storage nodes Q, QB by opening the access transistors and transferring charges from the bit lines BL, BLB. Data may be read from the storage cell by opening the access transistors and sensing the bit line voltages.

As these kinds of memory cells are volatile to their nature, it has been proposed to use programmable resistive memory elements, such as magnetic tunnel junctions (MTJs), to provide non-volatile data storage. The programmed resistive state is maintained even when a supply voltage of the storage cell is disconnected, and therefore data may be stored by such elements in a non-volatile fashion. Existing designs however introduce additional transistors and signal lines into each memory cell, for the purpose of controlling the resistive memory elements. This brings along a considerable area penalty for the memory cells.

SUMMARY

The present disclosure provides a memory cell for an SRAM which allows non-volatile storage of the logic states with a reduced area penalty. A more general outcome is to provide an area efficient circuit cell for either a memory device or a logic device allowing non-volatile storage of logic states of the circuit cell. Further and alternative outcomes may be understood from the following.

According to a first aspect of the present disclosure, there is provided a circuit cell for a memory device or a logic device, comprising: (i) a first and a second logic gate having a respective output node, wherein each output node is configured to hold either one of a complementary high and low logic level voltages; (ii) a select line; and (iii) a first and a second memory unit, each comprising a first terminal and a second terminal, and a resistive memory element and a bipolar selector connected in series between the first and second terminals, wherein the first terminals of the first and the second memory unit are connected to the output node of the first and second logic gate, respectively, and wherein the second terminals of the first and the second memory unit are connected to the select line; wherein each resistive memory element is configured to be switchable between a first and a second resistance state and in response to a switching current, and each bipolar selector is configured to be conducting in response to an absolute value of a voltage difference across the bipolar selector exceeding a threshold of the bipolar selector and non-conducting in response to the absolute value being lower than the threshold.

The circuit cell enables non-volatile storage of the logic states at the output nodes of the first and second logic gate (represented by the high and low logic level voltages). Since each output node is connected to a respective memory element comprising a resistive memory element, a high or low logic level voltage (which may be associated with a logic "1" and a logic "0," respectively) of an output node may be saved as a respective resistive state of the resistive memory element, which may be maintained in a non-volatile manner even after power is removed from the circuit cell. Saving the logic states of the output nodes as resistive states in the memory elements in turn allows the logic states of the output nodes to be restored when power is available again. Example embodiments of approaches for saving and restoring logic states are set out below.

The second terminals of the first and second memory units are connected to the select line. The second terminals of the first and second memory units may accordingly be configured to be supplied with a control voltage via a same select line. This enables a memory unit-control signal wiring structure with reduced complexity and area requirement, especially in comparison to approaches relying on additional dedicated transistors for programming the resistive memory elements.

Further, the bipolar selector of each memory element facilitates implementation approaches for saving and restoring logic states. Since the memory elements are connected to a same select line, both memory elements and associated output nodes may be addressed at a same time by a common control voltage set such that the bipolar selectors become conductive. Meanwhile, if the output nodes hold different logic levels, the threshold voltage of the bipolar selectors allow the output nodes to be independently accessed, i.e., a first control voltage may be applied to make only a bipolar selector connected to a high logic level output node conductive, and a second control voltage may be applied to make only a bipolar selector connected to a low logic level output node conductive.

In example embodiments, an absolute value of a difference between the high and low logic level voltages exceeds the threshold of each bipolar selector and is lower than two times the threshold of each bipolar selector. This specific level of the threshold of the bipolar selectors reduces the risk of current contention between the output nodes during access to the memory elements. For instance, in a scenario where the output nodes of the circuit cell hold complementary logic level voltages, it may hinder uncontrolled simultaneous opening of both bipolar selectors and further hinder the output node of the high logic level voltage to inject a current into the other output node of the low logic level via the select line. This may be understood by considering that each output node will "see" two bipolar selectors along a current path to the other output node.

The term resistive memory element may refer to an element that is programmable to adopt one of, i.e., switchable between, a first and a second resistive state. The programmed resistive state may be maintained even when a supply voltage of the memory cell is disconnected, and therefore logic states may be stored by such elements in a non-volatile fashion. In example embodiments, the resistive memory element is capable of being programmed by the direction of a current that is passed through the resistive memory element.

One implementation of a current-programmable resistive memory element is a magnetic tunnel junction (MTJ) element. In example embodiments, the resistive memory element of each memory unit is an MTJ element, also referred to herein as simply an "MTJ." An MTJ may comprise two ferromagnetic layers separated by a tunnel barrier layer. One of the two ferromagnetic layers, which may be referred to as the reference or pinned layer, may have a magnetization that is fixed in a particular direction. The other one of the two ferromagnetic layers, which may be referred to as the free layer, may have a magnetization direction that can be switched between two different directions or states, parallel with respect to the reference layer magnetization direction, (denoted a parallel state or P state of the free layer or the MTJ) and anti-parallel with respect to the reference layer magnetization direction (denoted an anti-parallel state or AP state of the free layer or the MTJ). An MTJ may be provided with an in-plane magnetic anisotropy or a perpendicular magnetic anisotropy (PMA). The electrical resistance of an MTJ may depend on whether the MTJ is in the AP state or the P state. The P state may be associated with a low(er) resistance state, and the AP state may be associated with a high(er) resistance state. In turn, a P state and an AP state may, for instance, be associated with a logic "1" and "0," respectively. An MTJ may be configured to be switchable between the P and AP states in response to a spin-transfer-torque (STT) inducing current.

An MTJ may be top-pinned, whereby the reference layer is arranged above the free layer and the tunnel barrier layer, or bottom-pinned, whereby the reference layer is arranged below the free layer and the tunnel barrier layer.

Depending on the configuration of the MTJs (e.g., top- or bottom-pinned) the first resistance state of the of the first and second memory unit may correspond to the parallel state, and the second resistance state may correspond to the anti-parallel state, or vice versa.

The term bipolar selector may refer to an element which may allow a current to pass in response to an absolute value of a voltage difference across the bipolar selector exceeding a threshold of the bipolar selector, and non-conducting in response to the absolute value being lower than the threshold. A bipolar selector is hence a bi-directional device in the sense that it may conduct or block a current in either direction.

Implementations of bipolar selectors that allow area-efficient and back end of line (BEOL) compatible integration include diode selectors and ovonic threshold switches.

Resistive memory elements and bipolar selectors are types which lend themselves to area-efficient and BEOL-compatible integration. That is, resistive memory elements and bipolar selectors may be arranged/incorporated in back end of line interconnect levels. The memory units may accordingly be added to the underlying memory/logic circuitry without any area penalty, or at least a reduced area penalty compared to other approaches. Accordingly, the circuit cell may comprise an device level and one or more back end of line interconnect levels arranged above the active device level, wherein the logic gates are arranged in the active device level, the memory units are arranged in the one or more interconnect levels, and the select line is arranged in the one or more interconnect levels, such as above the memory units.

The resistive memory element and the bipolar selector of the first memory unit may be stacked above the output node of the first logic gate, and the resistive memory element and the bipolar selector of the second memory unit may be stacked above the output node of the second logic gate. This allows a highly area efficient implementation of the memory units. The resistive memory element of the first/second memory unit may be stacked on top of the bipolar selector of the first/second memory unit, or vice versa. Further, the select line may be arranged above the memory units.

The output node of the first logic gate and the output node of the second logic gate may be complementary output nodes configured to hold complementary high and low logic voltage levels.

The first logic gate may be a first inverter, and the second logic gate may be a second inverter. The output node of the first inverter may be connected to an input node of the second inverter. Accordingly, the circuit cell allows non-volatile storage of the logic levels of two series-connected inverters. The inverters may be CMOS inverters.

The output node of the second inverter may be further connected to an input node of the first inverter. In other words, the two inverters may be cross-coupled to each other. This represents an important building block in circuit design, notably in SRAM.

The circuit cell may be an SRAM memory cell comprising a first half-cell comprising the first inverter and a second half-cell comprising the second inverter, wherein the output node of the first inverter forms a storage node of the first half-cell, and the output node of the second inverter forms a storage node of the second half-cell. As may be understood from the above discussion, this enables a non-volatile SRAM memory cell.

According to a second aspect of the present disclosure there is provided a memory or logic device comprising: (i) at least a first circuit cell according to the first aspect (or any of the above disclosed variations thereof); (ii) a power supply configured to power the logic gates of the first circuit cell via a high level voltage rail and a low level voltage rail, wherein each output node of the first circuit cell is configured to be supplied with either one of: the high logic level voltage via the high level voltage rail or the low logic level voltage via the low level voltage rail; and (iii) a driver connected to the select line of the first circuit cell.

This aspect may generally present the same or corresponding advantages as the former aspect.

According to an example embodiment, the device is configured to operate in a logic state save mode comprising a high and a low logic state save phase, and wherein during the high logic state save phase the driver is configured to apply a first control voltage to the select line set such that an absolute value of a difference between the first control voltage and the high logic level voltage exceeds the threshold of each bipolar selector, and an absolute value of a difference between the first control voltage and the low logic level voltage is lower than the threshold of each bipolar selector, wherein, in response to the driver outputting the first control voltage, a current flows from the high level voltage rail to the driver via each resistive memory element connected to an output node supplied with the high logic level voltage, the current causing setting of the each resistive memory element in the first resistance state; and wherein during the low logic state save phase the driver is configured to apply a second control voltage to the select line set such that an absolute value of a difference between the second control voltage and the low logic level voltage exceeds the threshold of each bipolar selector, and an absolute value of a difference between the second control voltage and the low logic level voltage is lower than the threshold of each bipolar selector, wherein, in response to the driver outputting the second control voltage, a current flows from the driver to the low level voltage rail via each resistive memory element connected to an output node supplied with the low logic level voltage, the current causing setting of each resistive memory element in the second resistance state.

This provides a simple and efficient approach enabling the logic states of the output nodes of the first circuit cell to be saved as first or second resistive states by the resistive elements.

The first control voltage is adapted such that an absolute value of a difference between the first control voltage and the low logic level voltage is lower than the threshold voltage of each bipolar selector. This makes it possible to access a "1" level output node independently from a "0" level output node since the bipolar selector connected to the "0" level output node will not become conductive in response to the first control voltage.

Conversely, the second control voltage is adapted such that an absolute value of a difference between the second control voltage and the high logic level voltage is lower than the threshold voltage of each bipolar selector. This makes it possible to access a "0" level output node independently from a "1" level output node since the bipolar selector connected to a "1" level output node will not become conductive in response to the second control voltage.

For an MTJ having the free layer located between the reference layer of the MTJ and the first terminal of a memory unit (i.e., the free layer connected in series between the reference layer and the first terminal) the first resistance state may correspond to the P state (i.e., lower resistance state), and the second resistance state may correspond to the AP state (i.e., higher resistance state).

Conversely, for an MTJ having the reference layer located between the free layer of the MTJ and the first terminal of a memory unit (i.e., the reference layer connected in series between the free layer and the first terminal) the first resistance state may correspond to the AP state (i.e., higher resistance state), and the second resistance state may correspond to the P state (i.e., lower resistance state).

According to an example embodiment, the device is configured to operate in a logic state load mode, wherein during the logic state load mode the power supply is configured to be switched off, and the driver is configured to apply a control voltage to the select line for restoring the logic states of the output nodes.

According to embodiments in which the first and second resistance states of the resistive memory elements correspond to the P- and AP-states, respectively, the driver may be configured to apply a third control voltage to the select line set such that a respective current flows from the driver into each respective output node at a rate dependent on a resistance of the resistive memory element of the memory unit connected to the respective output node. The third control voltage may be a high level voltage.

According to embodiments in which the first and second resistance states of the resistive memory elements correspond to the AP- and P-states, respectively, the driver may be configured to apply a fourth control voltage to the select line set such that a respective current flows from each respective output node to the driver at a rate dependent on a resistance of the resistive memory element of the memory element connected to the respective output node. The fourth control voltage may be a low level voltage.

Accordingly, in either case the driver may apply a single control voltage to the select line to cause charging or discharging of the output nodes at a rate that is dependent on the resistance states of the resistive memory elements. The voltages/charges at the output nodes may accordingly be shifted in relation to each other in such a manner that the logic levels, and thus the logic states, may be restored at the output nodes.

The logic state load mode may be combined with circuit cells comprising a pair of cross-coupled inverters, wherein the output nodes are configured to hold complementary logic levels.

According to an example embodiment, the device further comprises at least a second circuit cell according to the first aspect (or any of the above disclosed variations thereof), wherein the driver is connected to the select line of both the first and second circuit cells. The design of the circuit cells, with the memory units comprising bipolar selectors, allows two circuit cells (or more) to be controlled by a common driver.

According to an example embodiment, the first and the second circuit cells are arranged in a first column or row of a cell array of the device, and the driver forms a first driver, wherein the device further comprises: (i) at least a third and a fourth circuit cell arranged in a second column or row of the cell array; and (ii) a second driver connected to the select line of both the third and fourth circuit cells.

The select line of the first circuit cell and the second circuit cell may form a respective local select line of the respective circuit cell, the local select lines being connected to, or forming part of, a first common global select line extending along the first column or first row. Further, the select line of the third circuit cell and the fourth circuit cell may form a respective local select line of the respective circuit cell, the local select lines being connected to, or forming part of, a second common global select line extending along the second column or second row.

The power supply may be configured to power the logic gates of each one of the above-mentioned circuit cells via the high level voltage rail and the low level voltage rail, wherein each output node of each circuit cell is configured to be supplied with either one of: the high logic level voltage via the high level voltage rail or the low logic level voltage via the low level voltage rail.

BRIEF DESCRIPTION OF THE DRAWINGS

The above, as well as additional objects, features, and advantages of the present disclosure, will be better understood through the following illustrative and non-limiting detailed description, with reference to the appended drawings. In the drawings like reference numerals will be used for like elements unless stated otherwise.

FIG. 2 is a schematic illustration of a physical arrangement of circuit cell elements, according to an example embodiment.

All the figures are schematic, not necessarily to scale, and generally only show parts which are necessary to elucidate embodiments of the present disclosure, wherein other parts may be omitted or merely suggested.

DETAILED DESCRIPTION

Figure 1:
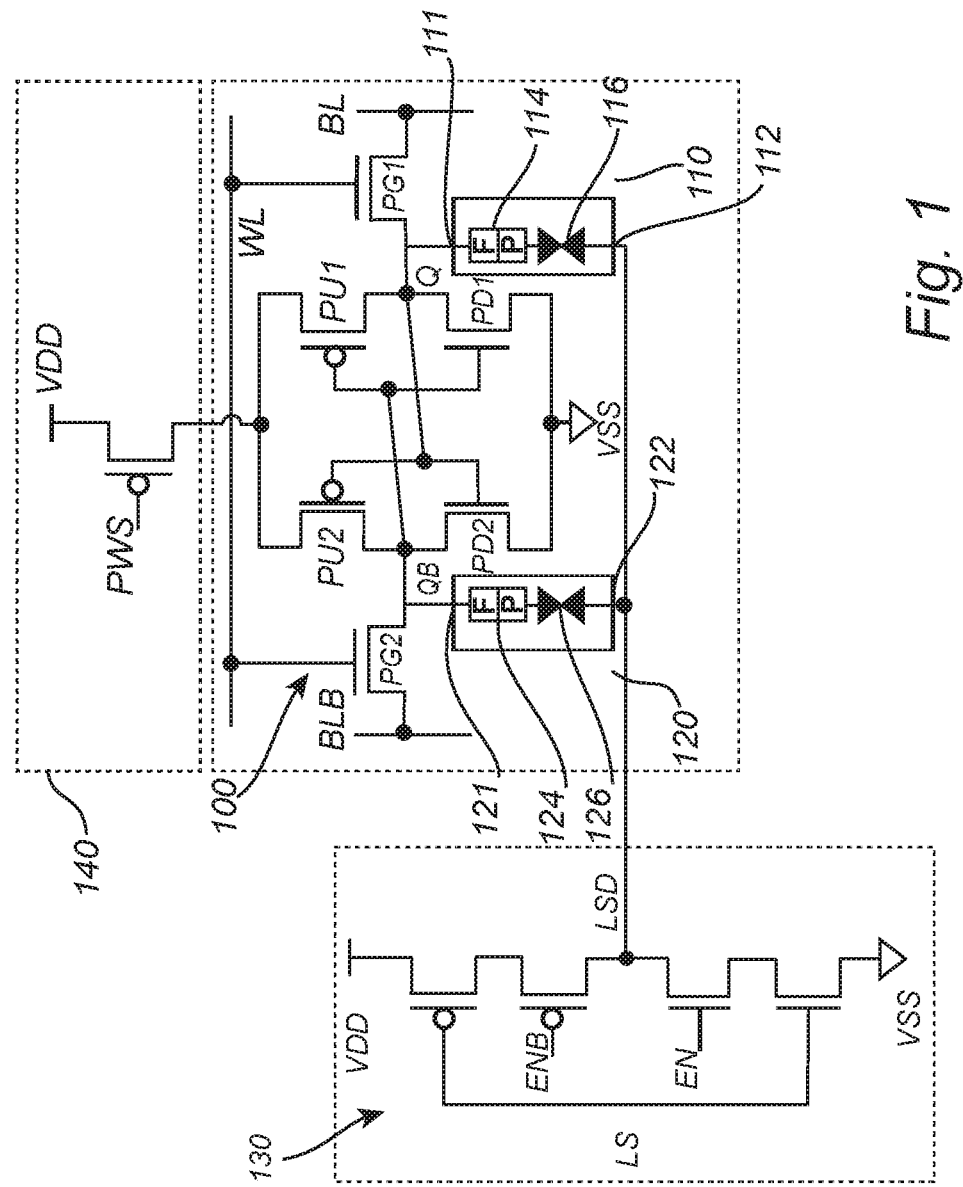
FIG. 1 depicts circuit schematics of a circuit cell for an SRAM device, according to an example embodiment.

FIG. 1 illustrates a circuit cell 100 in the form of an SRAM cell for an SRAM device. As will be conveyed by the following disclosure, the SRAM circuit cell is provided with a non-volatile logic state storage function. The SRAM cell may accordingly be referred to as a non-volatile SRAM cell, or "nvSRAM."

The memory or bit cell 100 shown in FIG. 1 is a 6-transistor bit cell and may accordingly be referred to as a 6T bit cell. It should however be noted that other SRAM configurations, e.g., comprising more than 6 transistors, are equally conceivable and possible to combine with memory units providing the non-volatile logic state storage function, as will be described in the following.

The bit cell 100 includes a first inverter arranged in a first half-cell and comprising first pull-up and pull-down transistors PU1 and PD1. The bit cell 100 includes a second inverter arranged in a second half-cell and comprising second pull-up and pull-down transistors PU2 and PD2. The drains of the first pull-up and pull-down transistors PU1, PD1 are connected to the node Q, forming the output node of the first inverter and a first SRAM storage node of the bit cell 100. The interconnected gates (thus being electrically common) of the first pull-up and pull-down transistors PU1, PD1 form the input node of the first inverter. The drains of the second pull-up and pull-down transistors PU2, PD2 are connected to the node QB, forming the output node of the second inverter and a second SRAM storage node of the bit cell 100. The interconnected gates (thus being electrically common) of the second pull-up and pull-down transistors PU2, PD2 form the input node of the second inverter.

The first and the second inverters are cross-coupled to each other to form a cross-coupled inverter pair. That is, the output node Q of the first inverter is connected to the input node of the second inverter, and the output node QB of the second inverter is connected to the input node of the first inverter.

The bit cell 100 further comprises a first pass transistor PG1 configured to switchably connect the output node Q to a bit line BL. The bit cell 100 further comprises a second pass transistor PG2 configured to switchably connect the output node QB to a bit line BLB, complementary to the bit line BL. The pass transistors PG1, PG2 are controlled via a word line WL.

The pull-down transistors PD1, PD2 and the pass transistors PG1, PG2 may each be formed by an n-type FET, such as an n-type metal-oxide-semiconductor FET (MOSFET). As used herein, the term "MOSFET" is considered to also include metal-insulator-semiconductor FETs, or MISFETs. The pull-up transistors PU1, PU2 may each be formed by a p-type FET, such as a p-type MOSFET.

The output nodes Q, QB of the bit cell 100 are configured to be selectively supplied with either one of a high logic level voltage via the pull-up transistors PU1 and PU2, respectively, or a low logic level voltage via the pull-down transistors PD1 and PD2, respectively. More specifically, the pull-up transistors PU1 and PU2 are configured to switchably connect the output nodes Q and QB, respectively, to a high level voltage rail VDD. The pull-down transistors PD1 and PD2 are configured to switchably connect the output nodes Q and QB, respectively, to a low level voltage rail VSS.

The high and low level voltages may be supplied by a power supply 140 configured to power the bit cell 100 via the high and low level voltage rails. The power may be switched on or off by a control switch PWS, which may, for instance, be implemented as a p-type FET.

As used herein, the term "voltage rail," or interchangeably "supply rail," means any electrical conductor (such as a wire, trace on a circuit board or chip, or similar) that is capable of providing bit cell 100 with a defined positive or negative potential, such as −12V, −5V, −3V, 0V (ground), 3V, 5V, or 12V, in order to provide power for operation of the circuit cell. Supply rails in this technical field are normally named VDD (positive), VSS (negative), or GND (ground). For the purposes of the following discussion, VSS and GND may be considered equivalent.

In the following, the terms high (logic) level voltage and low (logic) level voltage have their normal meaning within the technical field, i.e., two logical levels or states representing a binary one "1" and a binary zero "0." The high and low signals may be represented by two different voltages. In order distinguish between a high and low signal, high and low thresholds are specified. When the signal is below the low threshold, the signal is "low" and when above the high threshold, the signal is "high." As a non-limiting example, the binary logic input levels for CMOS may be 0V to ⅓ VDD for "low" and ⅔ VDD to VDD for "high."

In addition to the conventional elements of the SRAM bit cell, the bit cell 100 comprises a first and a second memory unit 110, 120. The first memory unit 110 comprises a resistive memory element 114 and a bipolar selector 116 connected in series between first and second terminals 111, 112 of the memory unit 110. The second memory unit 120 comprises a resistive memory element 124 and a bipolar selector 126 connected in series between first and second terminals 121, 122 of the memory unit 120. The first terminals 111, 121 of the first and the second memory units 110, 120 are connected to the output nodes Q, QB, respectively. The second terminals 112, 122 are connected to a select line LSD. The select line LSD may be connected to an output of a driver 130.

The LS inputs of the driver 130 represent a first control terminal and the EN and ENB inputs represent a complementary pair of second control terminals. In use, the driver 130 may accordingly selectively output a high logic level (e.g., VDD) and low logic level (e.g., VSS) to the select line LSD. It should be noted that the circuit schematics of the driver 130 only represent one possible example, and other driver implementations allowing selective output of high and low logic levels also are possible.

The resistive memory elements 114 and 124 may be formed by respective MTJs, being switchable between two resistance states, corresponding to a parallel P state and an anti-parallel AP state, by conducting a write current through the MTJ.

The bipolar selectors 116 and 126 may be formed by respective diode selectors or ovonic threshold switches (OTSs). Further examples of bipolar selectors include silicon-based selectors, metal-insulator-metal based selectors, metal-insulator transition (MIT) selectors, field assisted super-linear threshold (FAST) selectors, mixed ionic-electron conduction (MIEC) selectors, and 2D material based selectors (e.g., graphene or transition metal dichalcogenides such as $MoS_2$).

A bipolar selector switches to a conducting state on a condition that a voltage difference is applied across the bipolar selector which has an absolute value exceeding a threshold $V_{TH}$ of the bipolar selector. The bipolar selector remains in a non-conducting state as long as the absolute value of the voltage difference is lower than the threshold $V_{TH}$. In the following it will be assumed that the bipolar selectors 116 and 126 are configured to present at least substantially matching thresholds $V_{TH}$. In example embodiments, the high and low logic level voltages and the bipolar selectors 116, 126 are selected such that the difference between the high and low logic level voltages exceeds the threshold $V_{TH}$ but is lower than $2*V_{TH}$.

FIG. 2 shows a perspective view of a schematic of the bit cell 100 in a manner intended to convey the physical relationship between the inverters PU1/PD1 and PU2/PD2 and the memory units 110, 120. FIG. 2 depicts a substrate 10 supporting the bit cell 100. The inverters PU1/PD1 and PU2/PD2 are arranged in an active device level 20. The active device level (which as shown may also encompass an upper thickness portion of the substrate 10) may comprise the active semiconductor structures of the inverters PU1/PD1 and PU2/PD2, as well device level interconnects/contacts (such as source/drain contacts and gate electrodes). The memory units 110, 120 are arranged in one or more interconnect levels of a BEOL interconnect structure 30. The BEOL interconnect structure further comprises the select line LSD, which is arranged vertically above the memory units 110, 120. The first terminals 111, 121 of the memory units 110, 120 may accordingly be arranged between the select line LSD and a respective local interconnect connected to the output nodes Q, QB.

In FIG. 2, the resistive memory elements 114, 124 and the bipolar selectors 116, 126 are arranged in a common interconnect level. However, it is also possible to arrange the resistive memory elements 114, 124 and the bipolar selectors 116, 126 of each memory unit 110, 120 in two consecutive interconnect levels. It is further possible to arrange the select line in the same interconnect level as the memory units 110, 120. The memory units 110, 120 may, for instance, be accommodated within a thickness portion of the interconnect level corresponding to a (vertical) via height.

In FIGS. 1 and 2, the labels "F" and "P" indicated in each MTJ 114, 124 represent a free layer and a pinned layer, respectively. Accordingly, in FIGS. 1 and 2, the MTJ type resistive memory elements 114, 124 are "top-pinned." That is, the pinned layer "P" is arranged vertically above the free layer "F" (i.e., further from the first terminal 111 than the free layer "F"). It is, however, also possible to provide the MTJs 114, 124 in a "boa -pinned" configuration, where the pinned layer "P" is arranged vertically below the free layer "F" (i.e., closer to the first terminal 111 than the free layer "F"). Moreover, in FIGS. 1 and 2, memory units 110, 120 are depicted in a stacked configuration with the bipolar selectors 116, 126 arranged vertically above the MTJs 114, 124. It is, however, also possible to reverse the stacking order of the bipolar selectors 116, 126 and the MTJs 114, 124. These four different configurations of the memory units are schematically illustrated in FIGS. 3a-d, with reference to the memory unit 110.

Figures 3A, 3B, 3C, 3D:
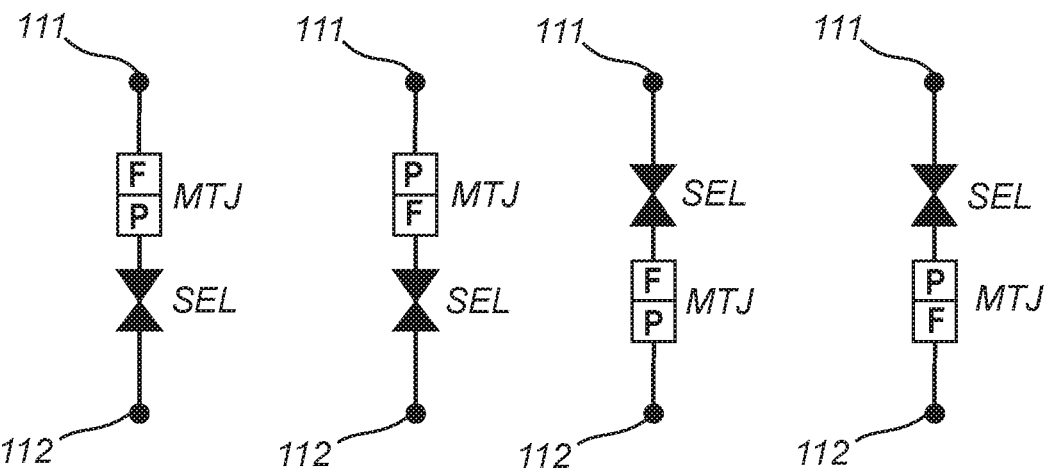
FIG. 3a shows a configuration of a memory unit, according to an example embodiment.
FIG. 3b shows a configuration of a memory unit, according to an example embodiment.
FIG. 3c shows a configuration of a memory unit, according to an example embodiment.
FIG. 3d shows a configuration of a memory unit, according to an example embodiment.

The top-pinned MTJs in FIGS. 3a and 3c may be set in the P state in response to a current flowing in a direction from the first terminal 111 to the second terminal 112 (corresponding to an oppositely directed flow of electrons from the second terminal 112 to the first terminal 111). The top-pinned MTJs in FIGS. 3a and 3c may be set in the AP state in response to a current flowing in a direction from the second terminal 112 to the first terminal 111 (corresponding to an oppositely directed flow of electrons from the first terminal 111 to the second terminal 112).

The bottom-pinned MTJs in FIGS. 3b and 3d may be set in the AP state in response to a current flowing in a direction from the first terminal 111 to the second terminal 112 (corresponding to an oppositely directed flow of electrons from the second terminal 112 to the first terminal 111). The bottom-pinned MTJs in FIGS. 3b and 3d may be set in the P state in response to a current flowing in a direction from the second terminal 112 to the first terminal 111 (corresponding to an oppositely directed flow of electrons from the first terminal 111 to the second terminal 112).

Various modes of operation of the bit cell 100 shown in FIGS. 1 and 2 comprising the top-pinned MTJs 114, 124 will now be described with reference to FIGS. 4-6. In "normal" SRAM operation, the power supply may power the bit cell, and a high or low logic level voltage "1" or "0" may be stored at the complementary output nodes Q and QB. The stored voltage may be sensed, accessed, or read by switching the pass transistors PG1, PG2 on and sensing the resulting charge or voltage of the bit lines BLB. Although not shown in FIG. 1, an SRAM may include circuitry for controlling reading and writing to the bit cells, pre-charging the bit lines, etc. An SRAM may further include sense amplifiers for sensing and amplifying signals on the bit lines during a reading operation. Implementing such circuitries and operations in an SRAM is known in the art and will not be further described herein.

Figure 4A:
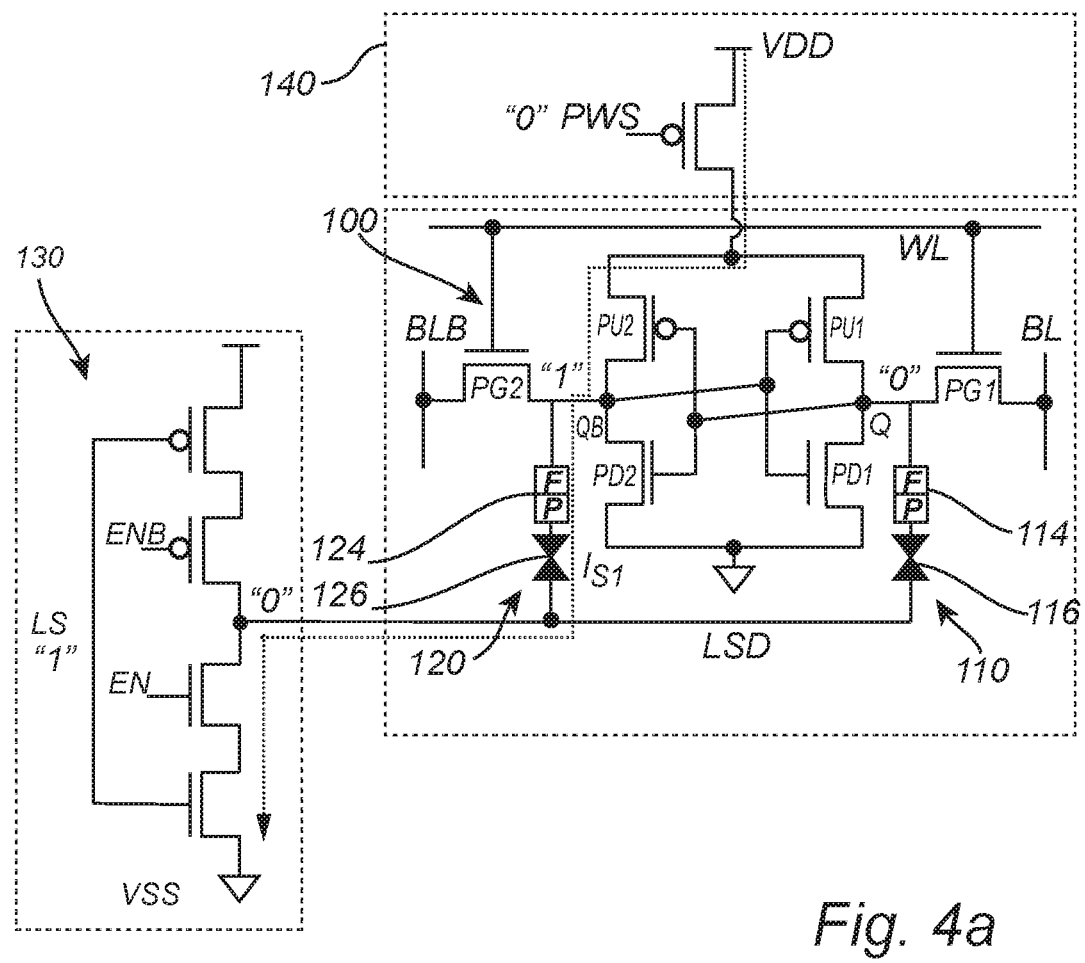
FIG. 4a illustrates a logic state save mode, according to an example embodiment.
Figure 4B:
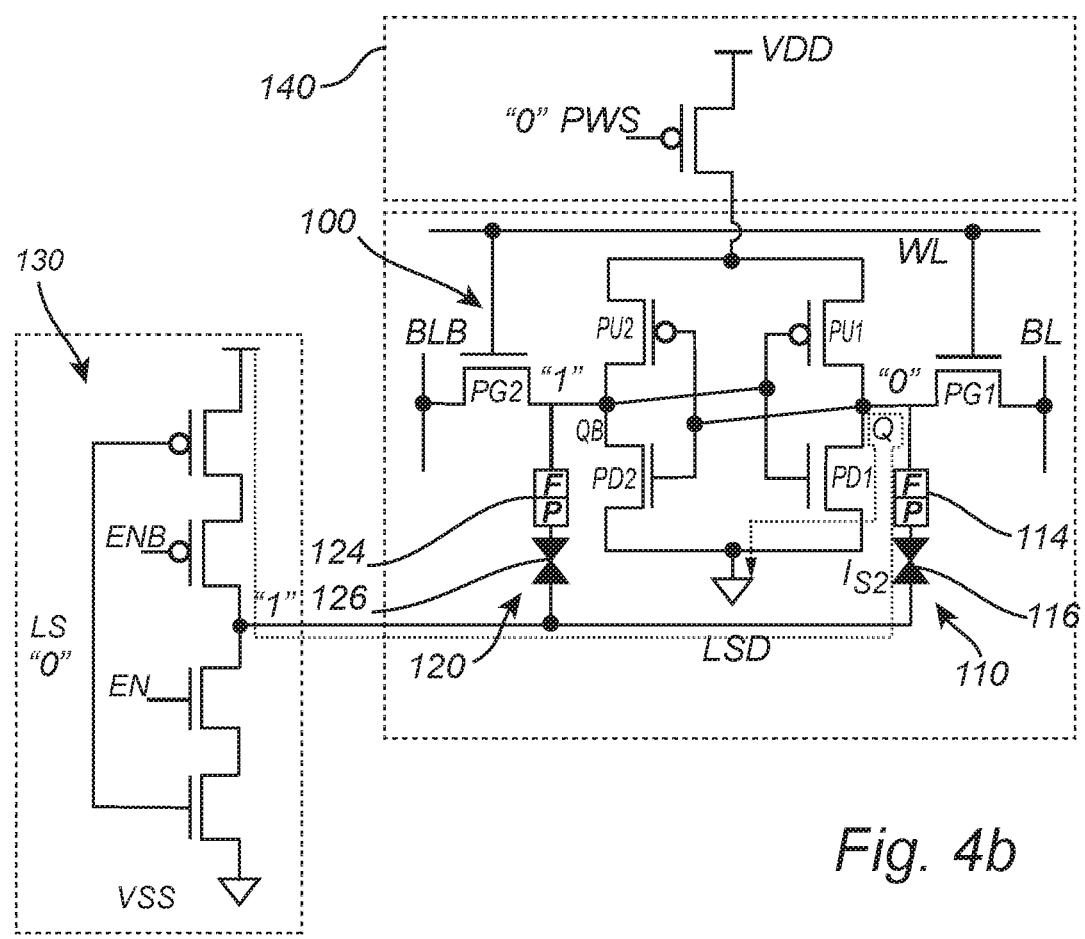
FIG. 4b illustrates a logic state save mode, according to an example embodiment.

FIGS. 4a and 4b illustrate the bit cell 100 during a "logic state save mode." This mode may be performed, for instance, prior to disabling the power supply to the bit cell 100. The bit cell 100 is accordingly powered by the power supply 140 during the logic state save mode. FIG. 4a illustrates a first "high logic state save phase" of the logic state save mode, and FIG. 4b illustrates a second "low logic state save phase" of the logic state save mode. The two phases may be performed in any order.

During the high logic state save phase, the driver 130 applies a first control voltage $V_{LS1}$ to the select line LSD. The first control voltage $V_{LS1}$ is a DC voltage set such that: on a condition that the output node Q holds a "1" level, the bipolar selector 116 becomes conductive, or on a condition that the output node QB holds a "1" level, the bipolar selector 126 becomes conductive.

The first control voltage $V_{LS1}$ is further set such that: on a condition that the output node Q holds a "0" level, the bipolar selector 116 remains non-conductive, or on a condition that the output node QB holds a "0" level, the bipolar selector 126 remains non-conductive.

In the illustrated scenario, the node QB holds the "1" level while the node Q holds the "0" level. Accordingly, in response to the application of the control voltage $V_{LS1}$ a write/switching current $I_{S1}$ may flow from the high level voltage rail VDD into the driver 130, through the second memory unit 120 and the select line LSD. The write current $I_{S1}$ flows in a bottom-up direction of the top-pinned MTJ 124 and may thereby switch the MTJ 124 into the parallel state P. A convenient choice for the first control voltage $V_{LS1}$ would be VSS (or GND), as suggested by the "0" level indication on the LSD in FIG. 4a. However, any other choice for the first control voltage $V_{LS1}$ meeting the above conditions would also suffice.

During the low logic state save phase, the driver 130 applies a second control voltage $V_{LS2}$ to the select line LSD. The second control voltage $V_{LS2}$ is a DC voltage set such that: on a condition that the output node Q holds a "0" level, the bipolar selector 116 becomes conductive, or on a condition that the output node QB holds a "0" level, the bipolar selector 126 becomes conductive.

The second control voltage $V_{LS2}$ is further set such that: on a condition that the output node Q holds a "1" level, the bipolar selector 116 remains non-conductive, or on a condition that the output node QB holds a "1" level, the bipolar selector 126 remains non-conductive.

In the illustrated scenario, the node Q holds the "0" level while the node QB holds the "1" level. Accordingly, in response to the application of the control voltage $V_{LS2}$ a write/switching current $I_{S2}$ may flow from the driver 130 via the select line LSD and into the low level voltage rail VSS, through the first memory unit 110. The write current $I_{S2}$ flows in a top-down direction of the top-pinned MTJ 114 and may thereby switch the MTJ 114 into the anti-parallel state AP. A convenient choice for the second control voltage $V_{LS2}$ would be VDD, as suggested by the "1" level indication on the LSD in FIG. 4b. However, any other choice for the second control voltage $V_{LS2}$ meeting the above conditions would also suffice.

Figure 5:
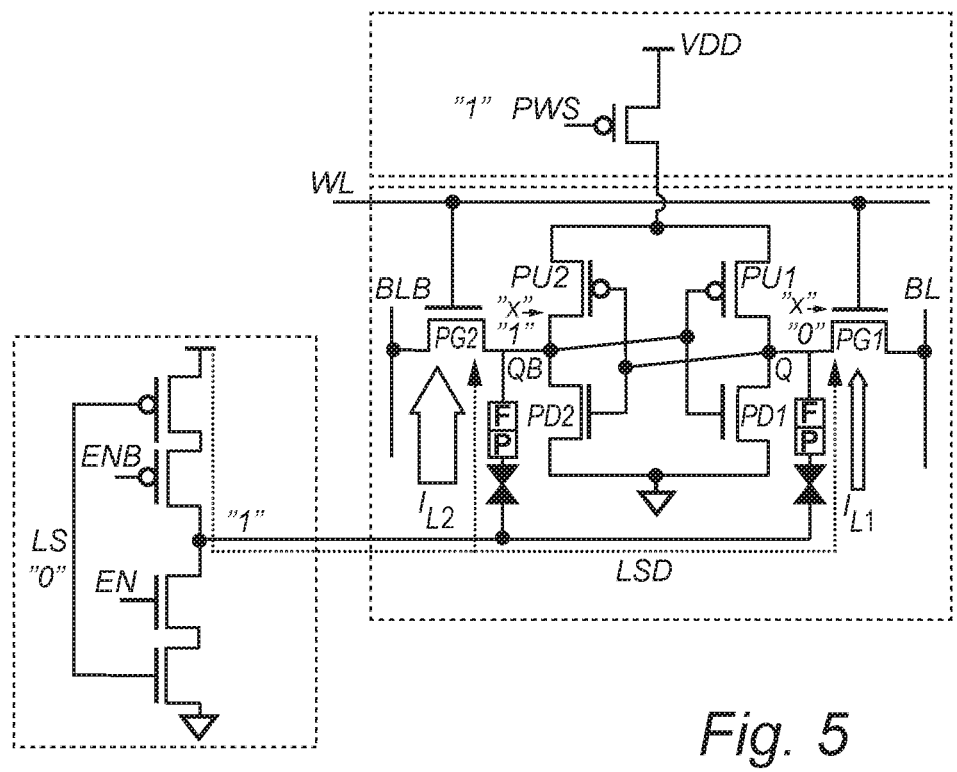
FIG. 5 illustrates a logic state load mode, according to an example embodiment.

FIG. 5 illustrates the bit cell 100 during a "logic state load mode" performed subsequent to the above disclosed logic state save mode. Accordingly, the MTJ 114 is set in the AP state (higher resistance) and the MTJ 124 is set in the P state (lower resistance). During the logic state load mode, the power supply 140 may be switched off (as indicated by the "1" level indication at the PWS input). The driver 130 applies a third control voltage ($V_{LS3}$) to the select line set such that a first charge current $I_{L1}$ may flow from the driver 130 into the output node Q, and a second charge current $I_{L2}$ may flow from the driver 130 into the output node QB. Since the resistance of the MTJ 114 of the first memory unit 110 is greater than the resistance of the MTJ 124 of the second memory unit 120, the current $I_{L2}$ flowing into the QB node will be greater than the current $I_{L1}$ flowing into the Q node. Consequently, the relative potentials of the QB and Q nodes may gradually shift towards the previous "1" and "0" logic levels.

The cross-coupling of the PU1/PD1 and PU2/PD2 inverters facilitate this operation in that the relative charging of the QB node in relation to the Q node may ensure that PD1 is opened during the load phase, wherein the Q node may be connected to the low level voltage supply (e.g., VSS). This may in turn ensure that PD2 is closed during the load phase, such that the QB node may be disconnected from the low level voltage supply (e.g., VSS). Hence, during load, the Q node voltage may be pulled-down relatively quickly to the low logic level while the QB node voltage may assume the high logic level.

As may be appreciated from the above, the third control voltage $V_{LS3}$ may be set such that an absolute value of a difference between the third control voltage and a voltage at each one of the output nodes Q, QB exceeds the threshold of each bipolar selector 116, 126, at least until a relative shifting of the Q and QB node voltages towards the "1" and "0" levels has been achieved. A convenient choice for the third control voltage $V_{LS3}$ would be VDD, as suggested by the "1" level indication on the LSD in FIG. 4b. However, any other choice for the third control voltage $V_{LS3}$ meeting the above conditions would also suffice.

Figure 6:
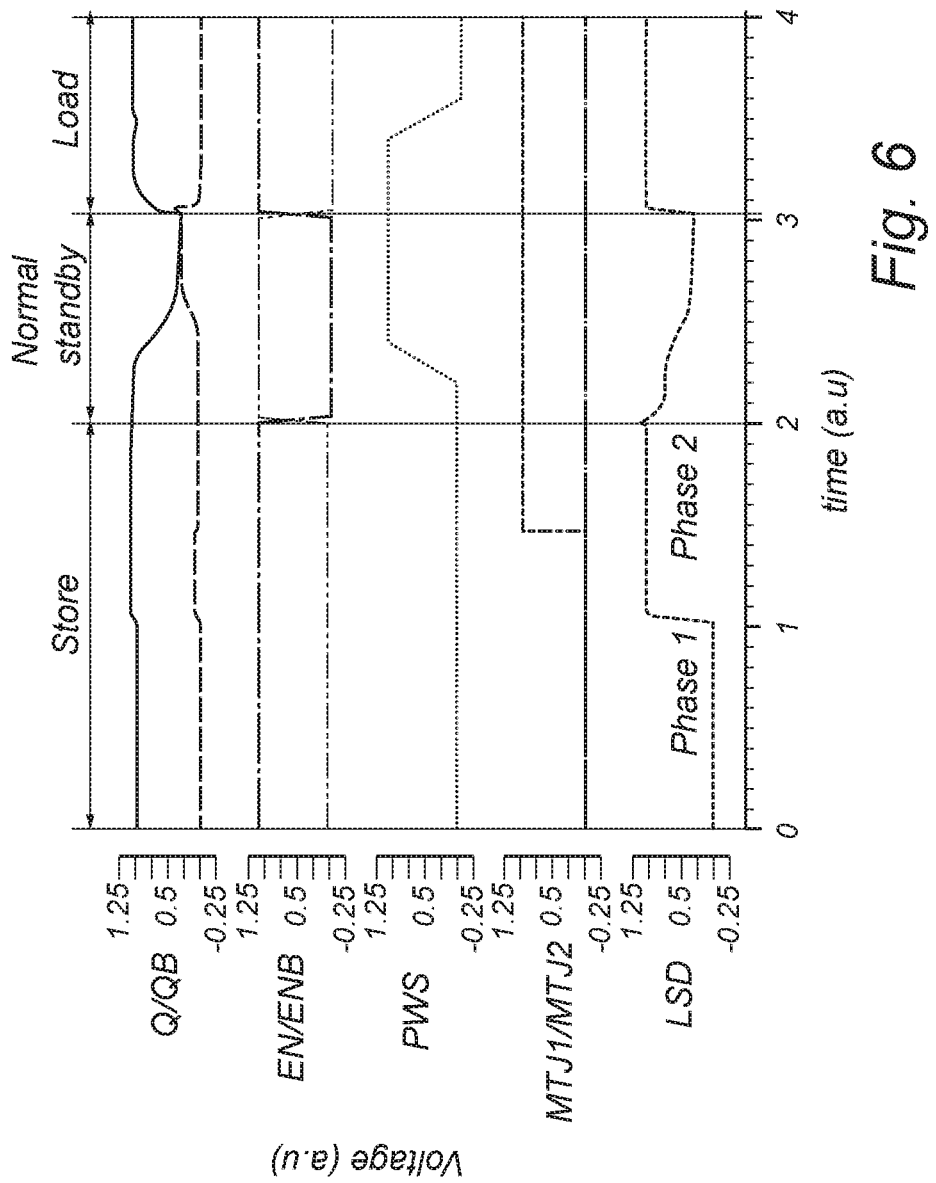
FIG. 6 illustrates waveforms during logic state save and load modes, according to an example embodiment.

FIG. 6 shows waveform simulations of the voltages at the output nodes Q, QB, the driver 130 control inputs EN/ENB, the power switch gate PWS, and the select line LSD during the logic state save mode and a subsequent logic state load mode. FIG. 6 further indicates the corresponding resistive states of the MTJs 114, 124, where a 0 level represents a parallel state and a 1 level represents an antiparallel state. During the normal standby mode, the power supply to the cell 100 may at some point be switched off, which will be followed by the Q and QB nodes losing their respective logic levels. During the load phase, the logic levels of the Q and QB nodes may be restored wherein the power supply to the cell 100 may be re-activated and normal operation may be resumed.

In the above, the logic state save mode and logic state load mode have been disclosed in connection with top-pinned MTJs. However, the modes are applicable also to bottom-pinned MTJs with appropriately selected control voltages. For bottom-pinned MTJs, the high and low logic state save phases may be implemented in a same manner. However, the high logic state save phase will result in the MTJ connected to the "1" level node (e.g., QB) switching to the AP state, while the low logic state save phase will result in the MTJ connected to the "0" level node (e.g., Q) switching to the P state. And during the logic state load mode, the driver 130 may be configured to output a (fourth) control voltage ($V_{LS4}$) to the select line, set such that a first discharge current $I_{L1}$ may flow from the "1" level node (e.g., QB) to the driver 130 (e.g., into the VSS rail thereof), and a second discharge current $I_{L2}$ may flow from the "0" level node (e.g., Q) to the driver 130 (e.g., into the VSS rail thereof). Since the resistance of the MTJ connected to the "1" level node (e.g., QB) is greater than the resistance of the MTJ connected to the "0" level node (e.g., Q), the current $I_{L2}$ flowing out from the "0" level node (e.g., Q) will be greater than the current $I_{L1}$ flowing out from the "1" level node (e.g., QB). Consequently, the relative potentials of the QB and Q nodes may gradually shift towards the previous "1" and "0" logic levels.

As may be appreciated from the above, the fourth control voltage $V_{LS4}$ may be set such that an absolute value of a difference between the fourth control voltage and a voltage at each one of the output nodes Q, QB exceeds the threshold of each bipolar selector 116, 126, at least until a relative shifting of the Q and QB node voltages towards the "1" and "0" level has been achieved. A convenient choice for the fourth control voltage $V_{LS4}$ would be VSS (or GND). However, any other choice for the fourth control voltage $V_{LS4}$ meeting the above conditions would also suffice.

Figure 7:
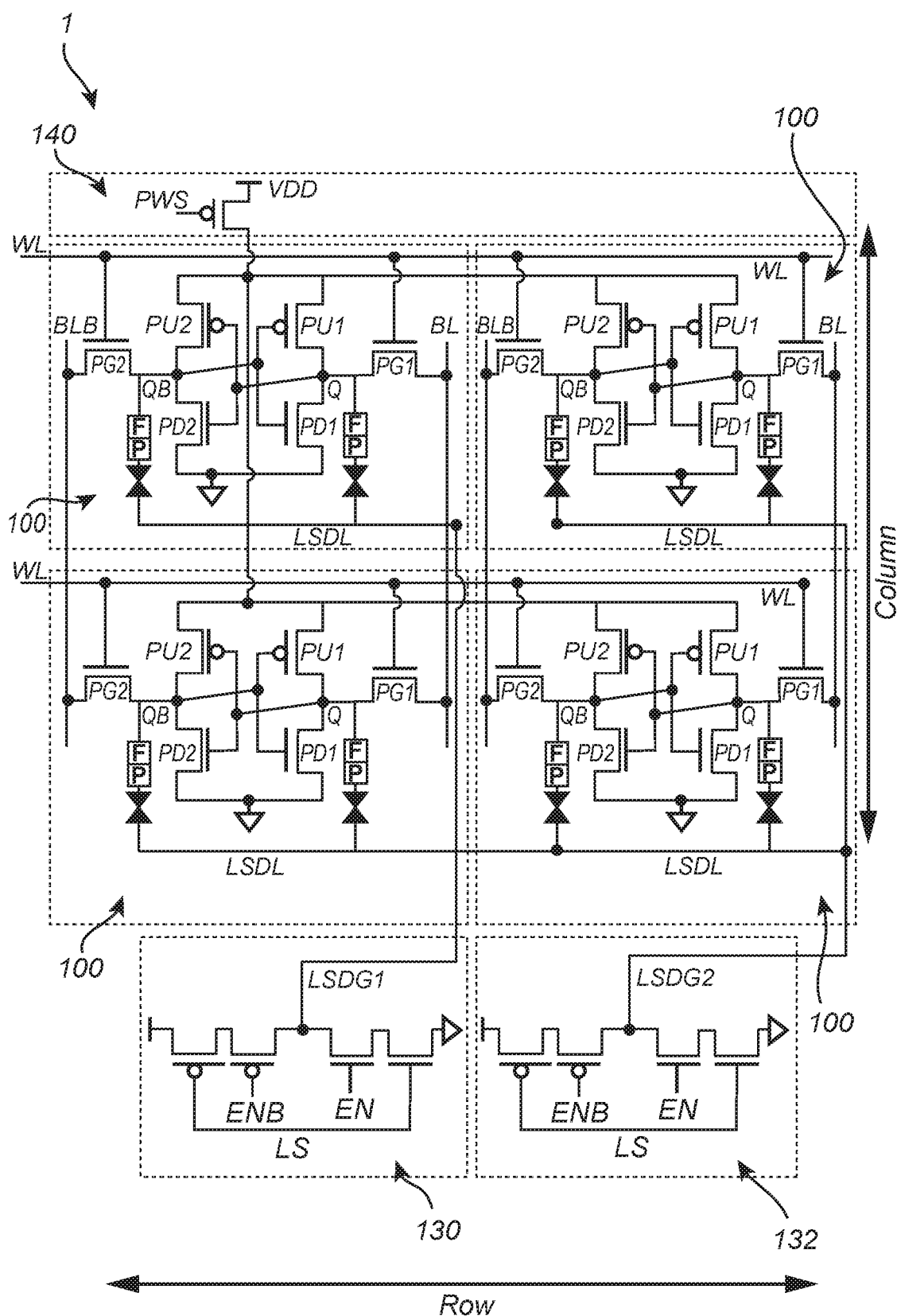
FIG. 7 illustrates a layout of an SRAM device, according to an example embodiment.
Figure 8:
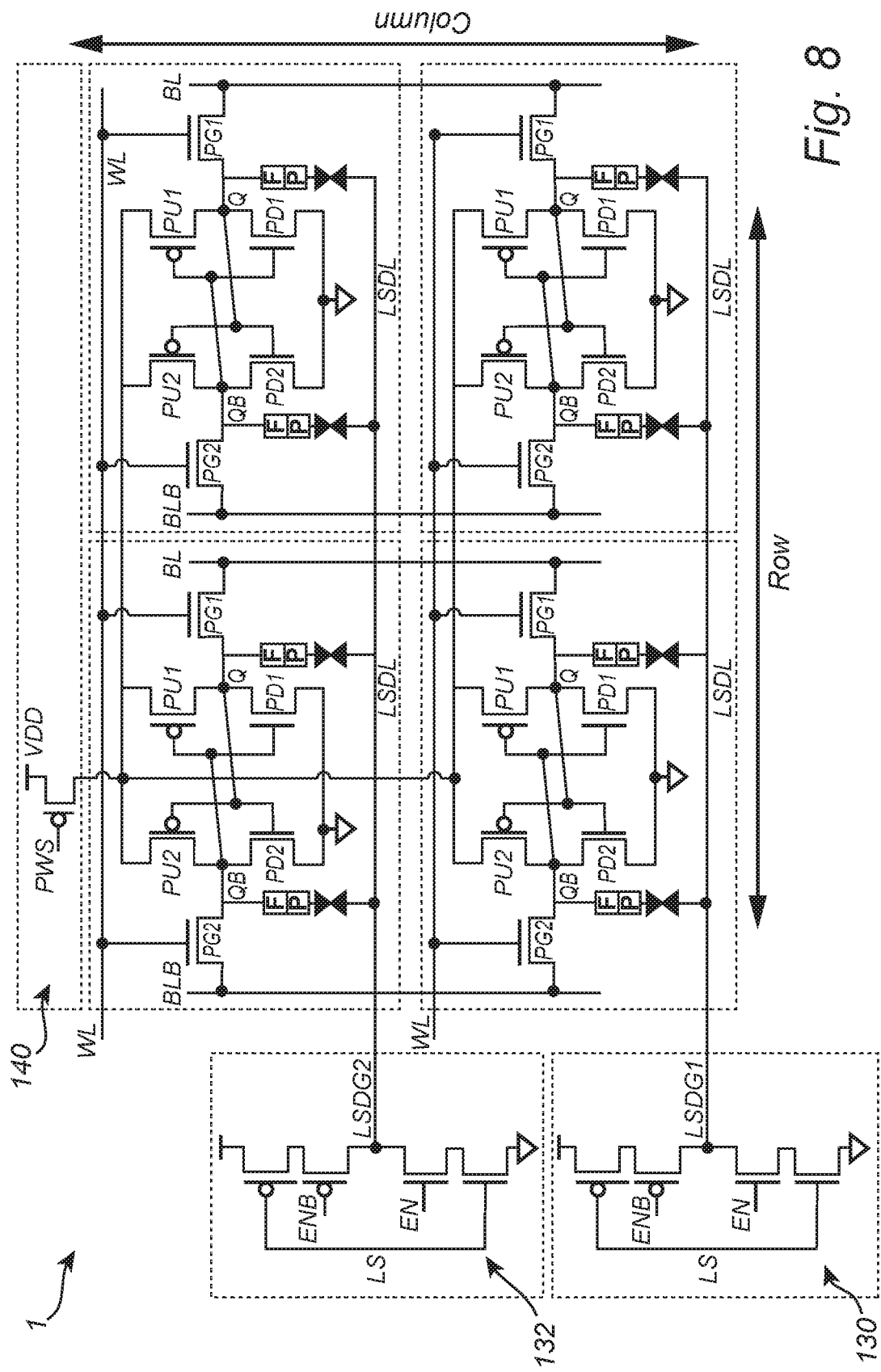
FIG. 8 illustrates a layout of an SRAM device, according to an example embodiment.

FIGS. 7 and 8 illustrate an SRAM device 1 comprising an array of identical or substantially identical bit cells 100. The array comprises first and second bit cells 100 arranged in a first column and third and fourth bit cells 100 arranged in a second column. The power supply 140 may be configured to power each one of the cells 100 of the array.

In FIG. 7, local select lines LSDL of the first and second bit cells 100 are connected to a first common global select line LSDG1, while local select lines LSDL of the third and fourth bit cells 100 are connected to a second common global select line LSDG2. The global select lines LSDG1, LSDG2 are routed along the column direction of the array.

FIG. 8 differs from FIG. 7 in that the local select lines LSDL of the first and second bit cells 100 form part of a first common global select line LSDG1, while the local select lines LSDL of the third and fourth bit cells 100 form part of a second common global select line LSDG2. The global select lines LSDG1, LSDG2 are routed along the row direction of the array.

In both cases, the first and second common global select lines LSDG1, LSDG2 are connected to an output of a respective driver 130, 132.

Figure 9:
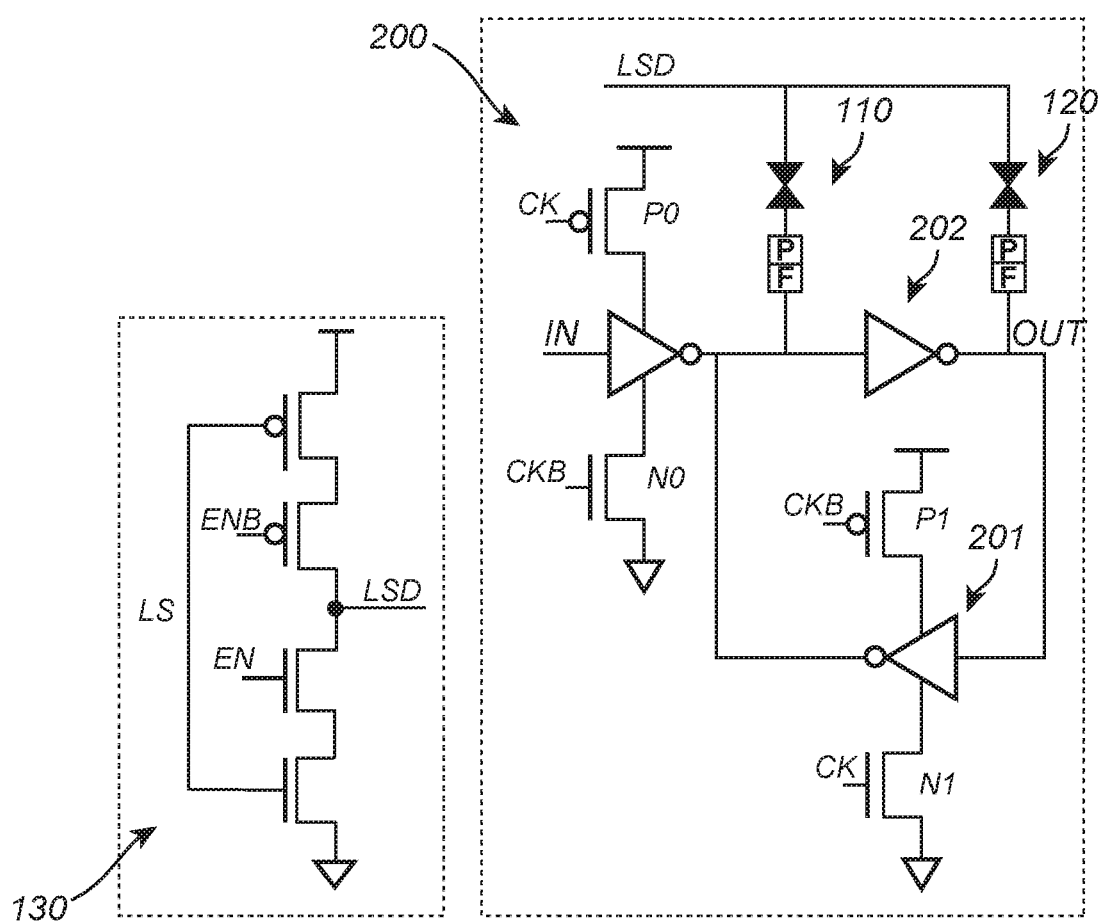
FIG. 9 illustrates a logic cell, according to an example embodiment.

It is also possible to provide a logic cell with a non-volatile logic state storing function in a similar manner as outlined above. FIG. 9 shows a schematic circuit layout of a flip-flop/latch type circuit cell 200. Similar to the bit cell 100, the logic circuit cell 200 comprises a pair of cross-coupled inverters 201, 202. Respective memory units 110, 120 are connected to the respective output nodes of the inverters 201, 202. The logic state save mode may be implemented in a same manner as discussed above in connection with the bit cell 100. Also, the logic state load mode may be implemented in a similar fashion. The first inverter 201 may be disconnected from the power supply. Moreover, the cross-coupled inverters 201, 202 may be isolated from the input stage circuitry (e.g., by switching P0 and N0 off). Moreover, the supply rail transistors P1, N1 of the second inverter 202 may be opened. This may be achieved by setting CK="1" and CKB="0." The driver 140 may thereafter apply an appropriately selected (third or fourth) control voltage to the LSD to restore the logic states of the complementary pair of nodes of the inverters 201, 202, as described above.

Although FIG. 9 illustrates a specific type of logic cell comprising logic gates in the form of inverters, it should be noted that it is possible to combine logic cells based on other gates with the memory units providing the non-volatile logic state storage function. Generally, a logic circuit may comprise a combination of logic gates implementing functions such as "AND," "NOT" (inverter), "NAND," "OR," "NOR," or exclusive "OR."

The present disclosure has mainly been described with reference to a limited number of examples. However, as will be readily appreciated, other examples than the ones disclosed above are equally possible within the scope of the disclosure, as defined by the appended claims.

What is claimed is:

1. A circuit cell for a memory device or a logic device, the circuit cell comprising:
   a first logic gate and a second logic gate having respective output nodes, wherein each output node is configured to hold one of a complementary high or low logic level voltage;
   a select line; and
   a first memory unit and a second memory unit, each respectively comprising: (i) a first terminal, (ii) a second terminal, (iii) a resistive memory element, and (iv) a bipolar selector connected in series with the resistive memory element between the first and second terminals, wherein the first terminal of the first memory unit is connected to the output node of the first logic gate, wherein the first terminal of the second memory unit is connected to the output node of the second logic gate, and wherein the second terminals of the first and the second memory units are connected to the select line, wherein each of the resistive memory elements is configured to be switchable between a first resistance state and a second resistance state in response to a switching current, and wherein each of the bipolar selectors is configured to be conducting in response to an absolute value of a voltage difference across the bipolar selector exceeding a threshold voltage of the bipolar selector and non-conducting in response to the absolute value of the voltage difference across the bipolar selector being lower than the threshold voltage.

2. The circuit cell according to claim 1, wherein an absolute value of a difference between the high and low logic level voltages exceeds the threshold voltage of each of the bipolar selectors and is lower than two times the threshold voltage of each of the bipolar selectors.

3. The circuit cell according to claim 1, wherein the resistive memory elements are magnetic tunnel junction (MTJ) elements.

4. The circuit cell according to claim 1, further comprising an active device level and one or more back end of line (BEOL) interconnect levels arranged above the active device level, wherein the first and second logic gates are arranged in the active device level, the first and second memory units are arranged in the one or more BEOL interconnect levels, and the select line is arranged in the one or more BEOL interconnect levels.

5. The circuit cell according to claim 4, wherein the resistive memory element and the bipolar selector of the first memory unit are stacked above the output node of the first logic gate, wherein the resistive memory element and the bipolar selector of the second memory unit are stacked above the output node of the second logic gate, and wherein the select line is arranged above the first and second memory units.

6. The circuit cell according to claim 1, wherein the output node of the first logic gate and the output node of the second logic gate are complementary output nodes configured to hold complementary high and low logic voltage levels.

7. The circuit cell according to claim 1, wherein the first logic gate is a first inverter and the second logic gate is a second inverter, and wherein the output node of the first inverter is connected to an input node of the second inverter.

8. The circuit cell according to claim 1, wherein the first and second logic gates are configured as a pair of cross-coupled inverters.

9. The circuit cell according to claim 8, wherein the cell is an SRAM memory cell comprising a first half-cell and a second half-cell, wherein the first half-cell comprises the first inverter and the second half-cell comprises the second inverter, and wherein the output node of the first inverter forms a storage node of the first half-cell and the output node of the second inverter forms a storage node of the second half-cell.

10. A memory or logic device comprising:
    a circuit cell comprising:
    (i) a first logic gate and a second logic gate having respective output nodes, wherein each output node is configured to hold one of a complementary high or low logic level voltage,
    (ii) a select line, and
    (iii) a first memory unit and a second memory unit, each respectively comprising: (a) a first terminal, (b) a second terminal, (c) a resistive memory element, and (d) a bipolar selector connected in series with the resistive memory element between the first and second terminals, wherein the first terminal of the first memory unit is connected to the output node of the first logic gate, wherein the first terminal of the second memory unit is connected to the output node of the second logic gate, and wherein the second terminals of the first and the second memory units are connected to the select line, wherein each of the resistive memory elements is configured to be switchable between a first resistance state and a second resistance state in response to a switching current, and wherein each of the bipolar selectors is configured to be conducting in response to an absolute value of a voltage difference across the bipolar selector exceeding a threshold voltage of the bipolar selector and non-conducting in response to the absolute value of the voltage difference across the bipolar selector being lower than the threshold voltage;

a power supply configured to power the first and second logic gates of the circuit cell via a high level voltage rail and a low level voltage rail, wherein each of the output nodes of the first and second logic gates of the circuit cell is configured to be supplied with either one of: (a) the high logic level voltage via the high level voltage rail or (b) the low logic level voltage via the low level voltage rail; and a driver connected to the select line of the circuit cell.

11. The memory or logic device according to claim 10, wherein the device is configured to operate in a logic state save mode comprising a high logic state save phase and a low logic state save phase;

wherein during the high logic state save phase the driver is configured to apply a first control voltage to the select line, the first control voltage set such that (a) an absolute value of a difference between the first control voltage and the high logic level voltage exceeds the threshold voltage of each of the bipolar selectors and (b) an absolute value of a difference between the first control voltage and the low logic level voltage is lower than the threshold voltage of each of the bipolar selectors, wherein, in response to the driver outputting the first control voltage, a first current flows from the high level voltage rail to the driver via the resistive memory element connected to one of the output nodes supplied with the high logic level voltage, and wherein the first current causes setting of the resistive memory element in the first resistance state; and wherein during the low logic state save phase the driver is configured to apply a second control voltage to the select line, the second control voltage set such that (a) an absolute value of a difference between the second control voltage and the low logic level voltage exceeds the threshold voltage of each of the bipolar selectors and (b) an absolute value of a difference between the second control voltage and the high logic level voltage is lower than the threshold voltage of each of the bipolar selectors, wherein, in response to the driver outputting the second control voltage, a second current flows from the driver to the low level voltage rail via the resistive memory element connected to one of the output nodes supplied with the low logic level voltage, and wherein the second current causes setting of the resistive memory element in the second resistance state.

12. The device according to claim 10, further configured to operate in a logic state load mode, wherein during the logic state load mode the power supply is configured to be switched off and the driver is configured to:

apply a third control voltage to the select line, the third control voltage set such that a respective current flows from the driver into each respective output node at a rate dependent on a resistance of the resistive memory element of the memory unit connected to the respective output node, or apply a fourth control voltage to the select line, the fourth control voltage set such that a respective current flows from each respective output node to the driver at a rate dependent on a resistance of the resistive memory element of the memory element connected to the respective output node.

13. The device according to claim 10, wherein the circuit cell is a first circuit cell, wherein the device further comprises at least a second circuit cell according to the first circuit cell, and wherein the driver is connected to the select line of both the first and second circuit cells.

14. The device according to claim 13, wherein the first and the second circuit cells are arranged in a first column or row of a cell array of the device, wherein the driver is a first driver, and wherein the device further comprises:

at least a third circuit cell and a fourth circuit cell according to the first and second circuit cells, the third and fourth circuit cells arranged in a second column or row of the cell array; and a second driver connected to the select line of both the third and fourth circuit cells.

15. The device according to claim 14, wherein the select line of the first circuit cell and the second circuit cell form first respective local select lines of the respective first and second circuit cells, the first local select lines being connected to or forming part of a first common global select line extending along the first column or first row, and wherein the select line of the third circuit cell and the fourth circuit cell form second respective local select lines of the respective third and fourth circuit cells, the second local select lines being connected to or forming part of a second common global select line extending along the second column or second row.

16. The device according to claim 10, wherein an absolute value of a difference between the high and low logic level voltages exceeds the threshold voltage of each of the bipolar selectors and is lower than two times the threshold voltage of each of the bipolar selectors.

17. The device according to claim 10, wherein the resistive memory elements are magnetic tunnel junction (MTJ) elements.

18. The device according to claim 10, further comprising an device level and one or more back end of line (BEOL) interconnect levels arranged above the active device level, wherein the first and second logic gates are arranged in the active device level, the first and second memory units are arranged in the one or more BEOL interconnect levels, and the select line is arranged in the one or more BEOL interconnect levels.

19. The device according to claim 18, wherein the resistive memory element and the bipolar selector of the first memory unit are stacked above the output node of the first logic gate, wherein the resistive memory element and the bipolar selector of the second memory unit are stacked above the output node of the second logic gate, and wherein the select line is arranged above the first and second memory units.

20. The device according to claim 10, wherein the output node of the first logic gate and the output node of the second logic gate are complementary output nodes configured to hold complementary high and low logic voltage levels.

* * * * *